(12) United States Patent
Nishibe et al.

(10) Patent No.: US 6,881,661 B2
(45) Date of Patent: Apr. 19, 2005

(54) MANUFACTURING METHOD OF SEMICONDUCTOR DEVICE

(75) Inventors: Haruhito Nishibe, Kawasaki (JP); Michio Oryoji, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/768,074

(22) Filed: Feb. 2, 2004

(65) Prior Publication Data

US 2004/0175931 A1 Sep. 9, 2004

(30) Foreign Application Priority Data

Feb. 26, 2003 (JP) .......................... 2003-049868

(51) Int. Cl.⁷ .......................................... H01L 21/4763
(52) U.S. Cl. ..................... 438/627; 438/637; 438/638; 438/687
(58) Field of Search ................ 438/627, 637, 438/638, 687, FOR 355, FOR 489

(56) References Cited

U.S. PATENT DOCUMENTS

| 5,989,997 | A | * | 11/1999 | Lin et al. ..................... 438/622 |
| 6,127,089 | A | * | 10/2000 | Subramanian et al. ..... 430/270.1 |
| 6,211,069 | B1 | * | 4/2001 | Hu et al. ..................... 438/637 |
| 6,242,340 | B1 | * | 6/2001 | Lee ............................. 438/624 |
| 6,358,842 | B1 | * | 3/2002 | Zhou et al. .................. 438/633 |
| 6,559,049 | B1 | * | 5/2003 | Chen et al. .................. 438/637 |
| 2004/0082164 | A1 | * | 4/2004 | Chen et al. .................. 438/633 |

OTHER PUBLICATIONS

Ghandi, Sorab K., "VLSI Fabrication Principles", 1983 by John Wiley & Sons, Inc., pp. 517–520.*
Patent Abstracts of Japan, Publication No. 11312669, dated Nov. 9, 1999.
Patent Abstracts of Japan, Publication No. 2001284327, dated Oct. 12, 2001.

* cited by examiner

Primary Examiner—George Fourson
Assistant Examiner—Michelle Estrada
(74) Attorney, Agent, or Firm—Westerman, Hattori, Daniels & Adrian LLP

(57) ABSTRACT

In a via-first Dual Damascene method, after a via hole and a wiring trench are formed, an SiN film, an exposed portion of an SiC film and an exposed portion of an SiC film are removed by etching. As a result, the via hole reaches a Cu wire, and the wiring trench reaches an SiOC film. A reaction product adheres mainly to a side wall portion of the wiring trench. The reaction product also adheres to other spots, but an amount of adherence to the side wall portion is the largest. Subsequently, oxygen plasma treatment is performed for insides of the via hole and the wiring trench. As a result of this oxygen plasma treatment, the reaction product is removed.

15 Claims, 11 Drawing Sheets

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2003-049868, filed on Feb. 26, 2003, the entire contents of which are incorporated herein by reference.

BACKGROUND OF THE INVENTION

1. Field of the Invention

The present invention relates to a manufacturing method of a semiconductor device preferable for formation of a wire layer.

2. Description of the Related Art

Following a demand for large-scale high integration and enhancement of speed of a semiconductor integrated circuit, a multilayered wire material with a low resistance and an interlayer insulating material of a small capacity are required. Consequently, in recent years, in order to meet the aforesaid demand, copper (Cu) comes to be used as a wire material and a low dielectic material comes to be used as an interlayer insulating film material, though an aluminum (Al) alloy has been used as a multilayered wire material and a silicone (SiO) oxide has been used as an interlayer insulating film material before.

However, microprocessing of copper itself is very difficult, and therefore a Damascene method is mainly employed to form a copper wire. The Damascene method is the method for forming a wire by forming a trench pattern, a via hole pattern and the like in an insulating film, thereafter, burying a copper material into these patterns, and then polishing (CMP: Chemical Mechanical Polishing) the copper material. In the Damascene method, there are a Dual Damascene method for forming a trench and a hole at the same time, and a Single Damascene method for forming them independently.

In many semiconductor devices, a plurality of wire layers are formed, and in their manufacturing process, a step of forming a via hole on a copper wire is required. However, copper has lower durability against oxygen plasma as compared with an aluminum alloy, which has been used as a wire material before. For this reason, when a resist mask used for formation of a via hole is removed, if the same ashing condition as in the case of the aluminum alloy is used as it is, there is a high possibility that a problem such as imperfect contact will occur. Consequently, in order to avoid such a problem, a processing method in which a surface of a copper wire is not exposed at the time of ashing is established.

In this processing method, a diffusion preventing film is formed between the copper wire and an interlayer insulating film, so that the diffusion preventing film temporarily stops formation of a trench pattern or a via hole pattern into the interlayer insulating film. Then, a resist mask is removed by ashing, and thereafter, the diffusion preventing film is etched. According to such a method, the surface of the copper wire is hardly exposed to oxygen plasma, and therefore the problem such as imperfect contact is prevented.

However, at least the surface of the copper wire is exposed at the time of etching of the diffusion preventing film. For this reason, it is known that at this time (when the surface of the copper wire is exposed), a reaction product adheres to a side wall portion and the like of the trench pattern. Consequently, wet treatment using a chemical solution is conventionally performed after etching of the diffusion preventing film, which is the last dry etching, is performed, and thereby the reaction product is removed.

Prior arts are disclosed in Japanese Patent Laid-open No. 11-312669, and Japanese Patent Laid-open No. 2001-284327.

However, in the case in which an $SiO_2$ film is used as the interlayer insulating film, a problem does not especially occur in the aforementioned conventional method, but when an SiOC film comes to be used recently as the interlayer insulating film with a lower dielectric constant, contact resistance rises, yields are reduced, and reliability is reduced.

The present invention is made in view of the above problems, and has its object to provide a manufacturing method of a semiconductor device capable of suppressing rise in contact resistance, reduction in yields and reliability even when the SiOC film is used as the interlayer insulating film.

SUMMARY OF THE INVENTION

As a result of repeating the earnest examination to solve the aforesaid problems, the inventors of the present application have found out that when the insulating film containing C such as an SiOC film is used as an interlayer insulating film, the generation amount of the reaction product is larger than when an $SiO_2$ film is used, and the reaction product cannot be sufficiently removed by only performing the wet treatment as in the prior art. The inventors of the present application have also found out that the remaining reaction product fell in the already formed via hole and the like and interfered with the later formation of the copper wire. Consequently, the inventors carried out the experiments using various chemical solutions in order to remove the reaction product by the wet treatment, but could not remove it completely without adversely affecting the surface of the copper wire and the low dielectric film (interlayer insulating film).

As a result of further carrying out the earnest examination, the inventors of the present application have considered the embodiments of the invention shown below.

A manufacturing method of a semiconductor device according to the present invention is intended for the manufacturing method of a semiconductor device having a process of forming wiring according to the Damascene method. In this manufacturing method, a diffusion preventing film and an interlayer insulating film are initially formed in sequence over a conductive layer. Next, an opening reaching the diffusion preventing film is formed in the interlayer insulating film. Next, dry etching for removing a portion of the diffusion preventing film exposed from the opening formed in the interlayer insulating film is performed. Thereafter, plasma treatment is performed for at least an inside of the opening by using plasma of a gas containing oxygen or hydrogen. A wire material is buried in the opening.

In the present invention, the plasma treatment using the plasma of the gas containing oxygen or hydrogen is performed before the wire material is buried in the opening, after the diffusion preventing film is selectively removed by dry etching. Consequently, even when an SiOC film is used as the interlayer insulating film and a large amount of reaction product adheres to a side wall of the opening by the dry etching, it is possible to remove the reaction product substantially completely by the plasma treatment. As a result, problems such as imperfect formation of a wire and reduction in reliability can be avoided.

DETAILED DESCRIPTION OF THE PREFERRED EMBODIMENTS

A manufacturing method of a semiconductor device according to embodiments of the present invention will be concretely explained with reference to the accompanying drawings hereinafter.

First Embodiment

A first embodiment of the present invention will be initially explained. The first embodiment is the application of the present invention to a via-first Dual Damascene method. FIGS. 1A to 1K are sectional views showing the manufacturing method of the semiconductor device according to the first embodiment of the present invention in the order of steps.

Figure 1A:
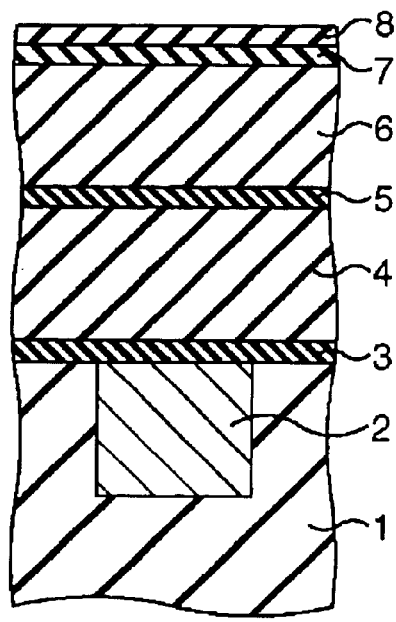
FIGS. 1A to 1K are sectional views showing a manufacturing method of a semiconductor device according to a first embodiment of the present invention in the order of steps.

In this embodiment, after a semiconductor element (not shown) such as a transistor is initially formed on a surface of a semiconductor substrate (not shown) such as an Si substrate, an interlayer insulating film 1 is formed above the semiconductor substrate as shown in FIG. 1A. Next, a trench is formed in this interlayer insulating film 1, and a Cu wire 2 connected to the aforesaid semiconductor element is buried in the trench. Thereafter, an SiC film 3, an SiOC film 4 (interlayer insulating film), an SiC film 5 (etching stopper film), an SiOC film 6 (second interlayer insulating film), a TEOS (Tetra Ethyl Ortho Silicate) film 7 and an SiN film 8 are formed in sequence on and above the interlayer insulating film 1 and the Cu wire 2. The thickness of the SiC film 3 is 30 nm to 70 nm, the thickness of the SiOC film 4 is 400 nm to 700 nm, the thickness of the Sic film 5 is 30 nm to 70 nm, the thickness of SiOC film 6 is 300 nm to 600 nm, the thickness of the TEOS film 7 is 50 nm to 100 nm, and the thickness of the SiN film 8 is 30 nm to 70 nm. The SiC film 3 functions as a diffusion preventing film which prevents diffusion of Cu in the Cu wire 2. The SiN film 8 functions as a reflection preventing film.

Figure 1B:
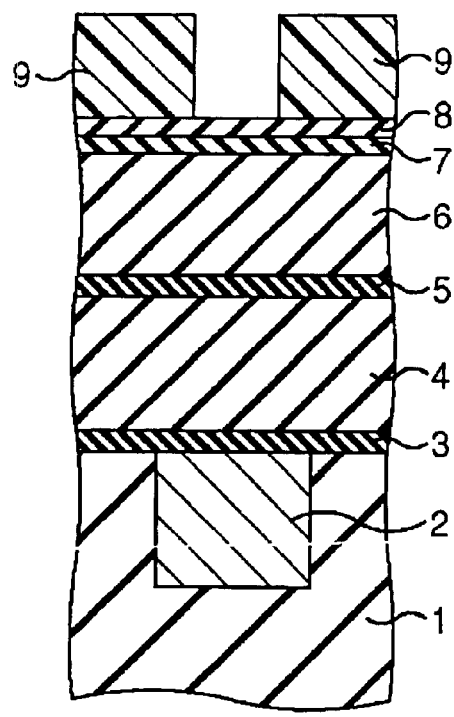

Subsequently, a resist film 9 for a via hole which is provided with an opening for the via hole is formed on the SiN film 8 as shown in FIG. 1B. The thickness of the resist film 9 is, for example, about 500 nm to 800 nm.

Figure 1C:
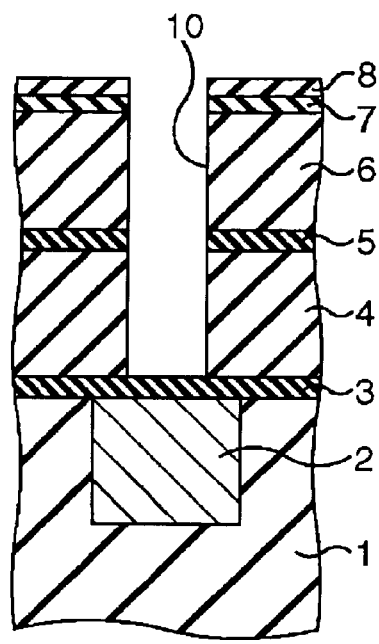

Next, as shown in FIG. 1C, with use of the resist film 9 as a mask, a via hole 10 (opening) is formed in the SiN film 8, the TEOS film 7, the SiOC film 6, the SiC film 5 and the SiOC film 4. An etching condition of each of the films at this time is as follows.

Etching of the SiN film 8 and the TEOS film 7 is continuously performed, for example, under the condition of a flow rate of $CF_4$: 100 sccm, pressure: 6.67 Pa (50 mTorr), RF source power: 300 W, time: 30 seconds, and temperature: 25° C.

Etching of the SiOC film 6 is performed with use of the SiC film 5 as an etching stopper, for example, under the condition of a flow rate of $CHF_3$: 10 sccm, a flow rate of $O_2$: 5 sccm, a flow rate of Ar: 750 sccm, pressure: 13.3 Pa (100. mTorr), RF source power: 1000 W, time: 45 seconds, and temperature: 25° C.

Etching of the SiC film 5 and the SiOC film 4 is initially performed continuously, for example, under the condition of the flow rate of $CF_4$: 50 sccm, a flow rate of $CH_2F_2$: 15 sccm, the flow rate of $O_2$: 5 sccm, pressure: 26.6 Pa (200 mTorr), RF source power: 1000 W, time: 30 seconds, and temperature: 25° C. Under this condition, a selection ratio of the SiC film 5 and the SiOC film 4 is comparatively small. Next, before etching of the SiOC film 4 is finished, etching of the SiOC film 4 is further performed, for example, under the condition of a flow rate of $C_4F_6$: 15 sccm, the flow rate of $O_2$: 30 sccm, a flow rate of CO: 500 sccm, the flow rate of Ar: 300 sccm, pressure: 5.33 Pa (40 mTorr), RF source power: 1000 W, time: 75 seconds, and temperature: 25° C. Under this condition, the selection ratio of the SiOC film 4 and the SiC film 3 is extremely large, and the SiC film 3 is hardly etched.

After the via hole 10 is formed, the resist film 9 is removed by ashing as shown in FIG. 1C. The ashing condition at this time is, for example, the flow rate of $O_2$: 250 sccm, pressure: 10.7 Pa (80 mTorr), RF source power 150 W, time: 120 seconds, and temperature: 25° C.

Figure 1D:
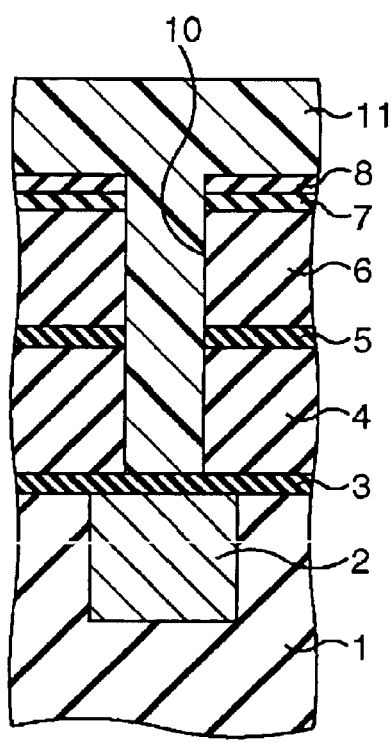

Next, as shown in FIG. 1D, a resin material 11 is formed on an entire surface so as to be filled in the via hole 10. The thickness of the resin material 11 is, for example, 300 nm to 500 nm on the SiN film 8.

Figure 1E:
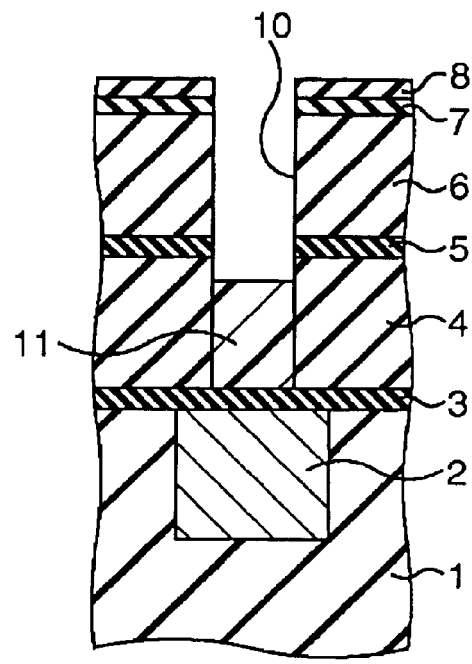

Thereafter, as shown in FIG. 1E, etching of an entire surface of the resin material 11 is performed, and the resin material 11 (buried material) with a predetermined height is allowed to remain in the via hole 10. The height of the resin material 11 is smaller than the thickness of the SiOC film 4. The resin material 11 with the predetermined height may be allowed to remain in the via hole 10 by developing the resin material 11 instead of performing the etching of the entire surface of the resin material.

Figure 1F:
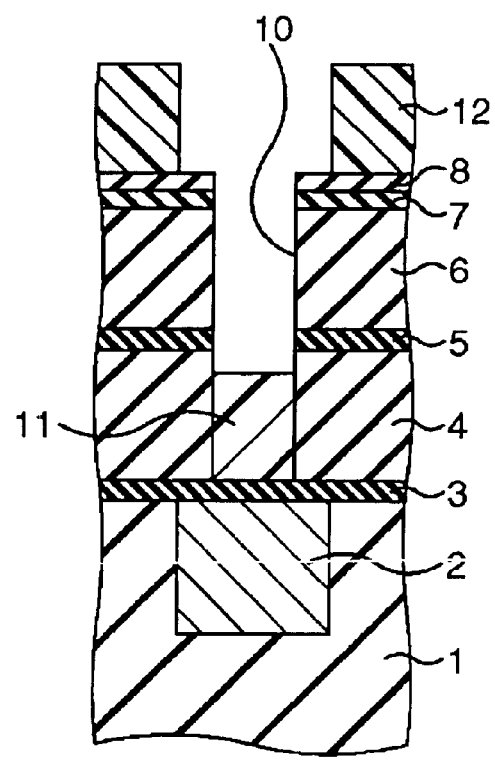

Subsequently, as shown in FIG. 1F, a resist film 12 for a wiring trench provided with an opening for the wiring trench is formed on the SiN film 8. The thickness of the resist film 12 is, for example, about 500 nm to 800 nm.

Figure 1G:
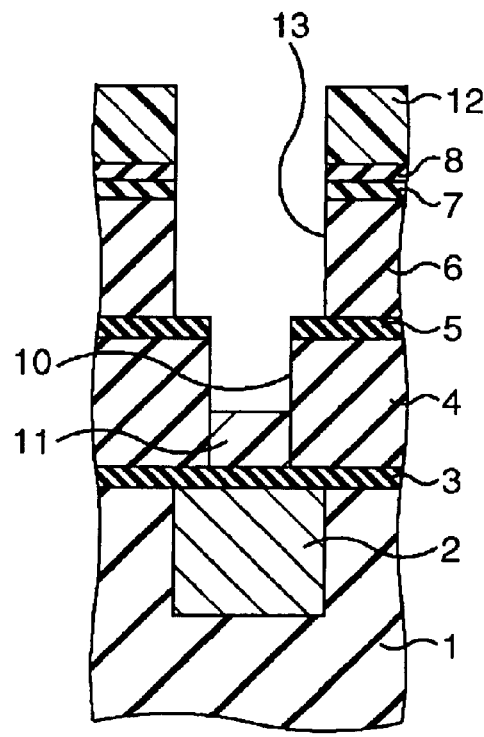

Next, as shown in FIG. 1G, with use of the resist film 12 as a mask, a wiring trench 13 is formed in the SiN film 8, the TEOS film 7 and the SiOC film 6. The etching condition of each of the films at this time is, for example, the flow rate of $CF_4$: 100 sccm, the flow rate of $O_2$: 5 sccm, pressure: 13.3 Pa (100 mTorr), RF source power: 1000 W, time: 30 seconds, and temperature: 25° C. At this time, the resin material 11 is also etched a little.

Figure 1H:
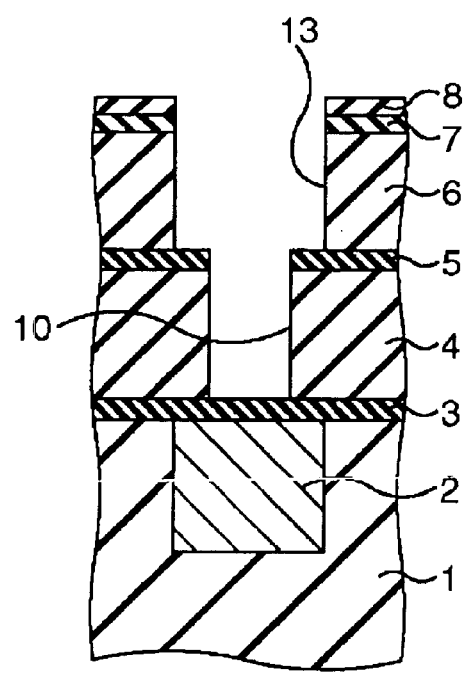

Next, as shown in FIG. 1H, the resist film 12 and the resin material 11 are removed by ashing. The ashing condition at this time is, for example, the flow rate of $O_2$: 250 sccm, the flow rate of $CF_4$: 10 sccm, pressure: 13.3 Pa (100 mTorr), RF source power: 150 W, time: 120 seconds, and temperature: 25° C.

Figure 1I:
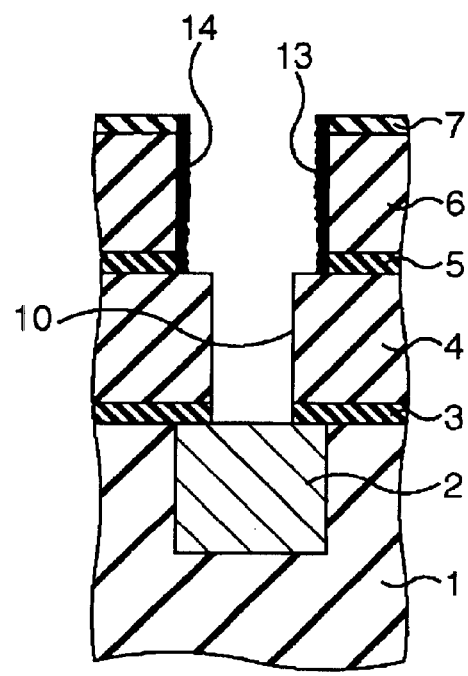
Figure 2A:
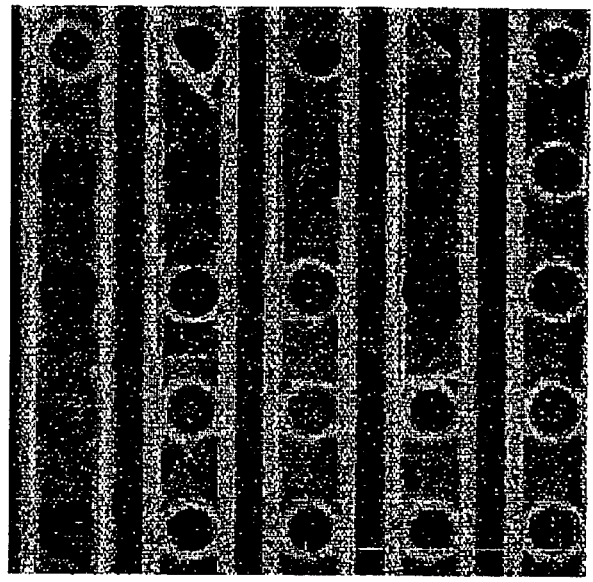
FIG. 2A is a scanning electron microscope photograph showing a generation state of a reaction product.

Thereafter, as shown in FIG. 1I, the SiN film 8, an exposed portion of the SiC film 5 and an exposed portion of the SiC film 3 are removed by etching. The etching condition at this time is, for example, the flow rate of $CHF_3$: 15 sccm, the flow rate of $CF_4$: 85 sccm, pressure: 13.3 Pa (100 mTorr), RF source power: 300 W, time: 30 seconds, and temperature: 25° C. As a result, the via hole 10 reaches the Cu wire 2 and the wiring trench 13 reaches the SiOC film 4. A reaction product 14 mainly adheres to a side wall portion of the wiring trench 13. The reaction product 14 also adheres to other spots, but the amount of adherence to the side wall portion of the wiring trench 13 is the largest. This reaction product 14 is considered to occur as a result that only a small part of the SiOC film 4 is etched after the exposed portion of the SiC film 5 is removed. FIG. 2A is an SEM (scanning electron microscope) photograph showing a generation state of the reaction product.

Figure 1J:
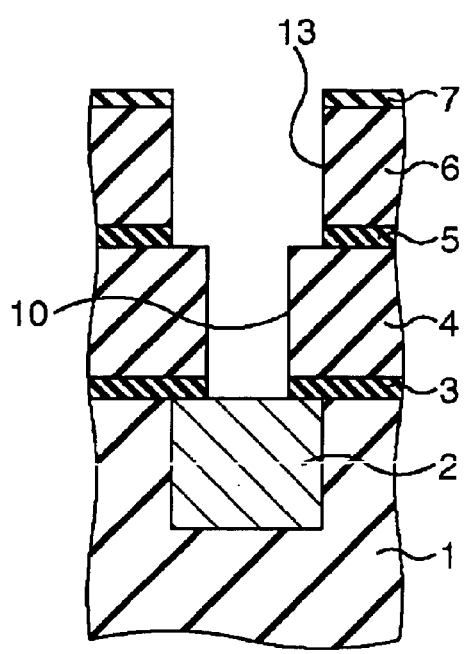
Figure 2B:
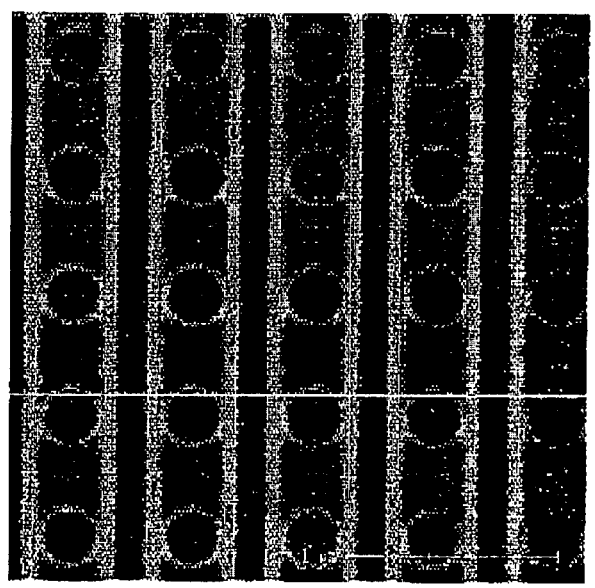
FIG. 2B is a scanning electron microscope photograph showing a state in which the reaction product is removed.

Subsequently, oxygen plasma treatment is performed for insides of the via hole 10 and the wiring trench 13. The treatment condition at this time is, for example, the flow rate of $O_2$: 600 sccm, pressure: 40.0 Pa (300 mTorr), RF source power: 300 W, time: 60 seconds, and temperature: 25° C. As a result of this oxygen plasma treatment, the reaction product 14 is removed as shown in FIG. 1J. FIG. 2B is the SEM (scanning electron microscope) photograph showing the state in which the reaction product is removed.

Next, as wet treatment, the entire surface is cleaned by using a chemical solution containing ammonium fluoride, ammonium phosphate or the like. As a result of this, a fine residue and the like are washed away.

Figure 1K:
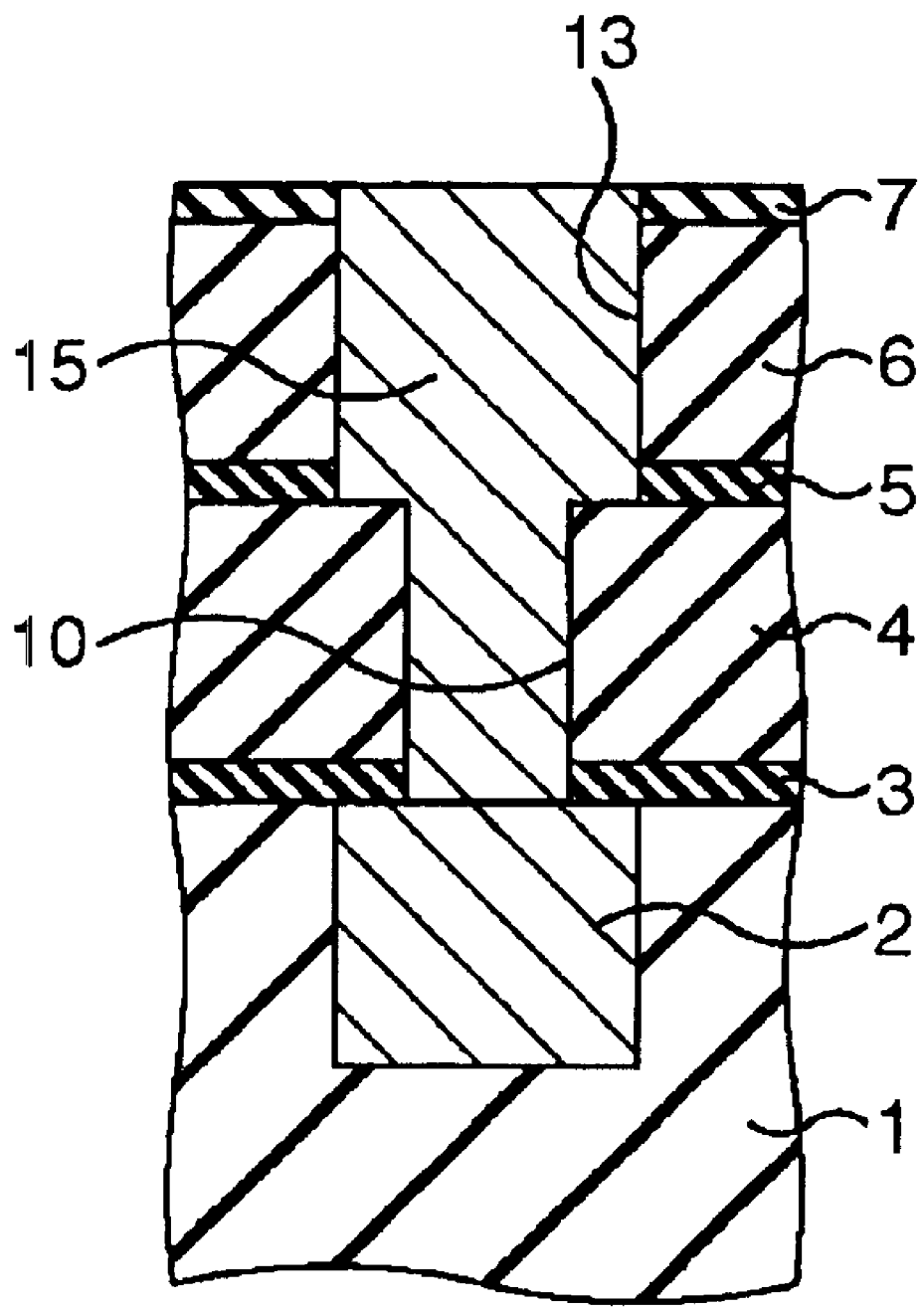

As shown in FIG. 1K, a Cu wire 15 (wire material) is buried in the via hole 10 and the wiring trench 13. Thereafter, an interlayer insulating film, a wire and the like are further formed as necessary, and the semiconductor device is completed.

Figure 3:
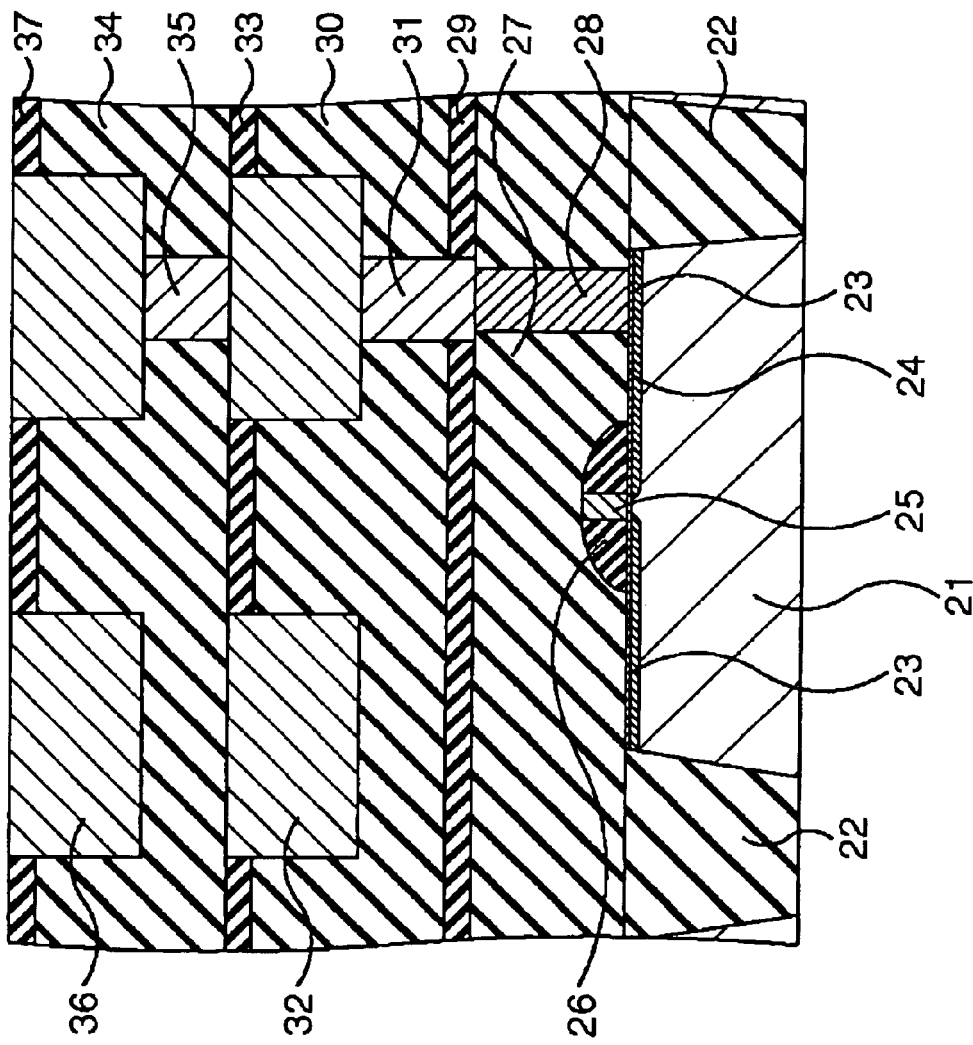
FIG. 3 is a sectional view showing a structure of the semiconductor device manufactured by applying the first embodiment thereto.

FIG. 3 is a sectional view showing a structure of the semiconductor device manufactured by applying the first embodiment. In the example shown in FIG. 3, an element isolating region 22 is formed on a surface of a semiconductor substrate 21, and a transistor is formed in an element active region partitioned by the element isolating region 22. The transistor is provided with a source and drain region 23 formed on the surface of the semiconductor substrate 21, a gate insulating film 24 formed on the semiconductor substrate 21, a gate electrode 25 formed on the gate insulating film 24, and a side wall 26 each formed at a side of the gate electrode 25. An interlayer insulating film 27 is formed to cover this transistor. A contact plug 28 which reaches the source and drain region 23 is buried in the interlayer insulating film 27.

Further, an SiC film 29, an interlayer insulating film 30, an SiC film 33, an interlayer insulating film 34 and an SiC film 37 are formed in layers in sequence on an entire surface. A via plug 31, a wire 32, a via plug 35 and a wire 36 are buried in these films. The via plugs 31 and 35 correspond to a portion of the Cu wire 15 existing in the via hole 10 in FIG. 1K, and the wires 32 and 36 correspond to a portion existing inside the wiring trench 13. As is shown, in the example shown in FIG. 3, the multilayered wire of at least two layers is formed by the manufacturing method according to the first embodiment.

As described above, according to the first embodiment, the oxygen plasma treatment is performed before the Cu wire 15 is formed, after a part of the Cu wire 2, which is a lower layer wire, is exposed, and therefore the reaction product 14 can be removed. This is made obvious by comparing FIG. 2A and FIG. 2B with each other. As a result, the Cu wire 15, which is formed thereafter, and the Cu wire 2 can be connected in a favorable state, and imperfect contact and increase in contact resistance can be prevented. Reduction in reliability due to the remaining reaction product 14 can be also prevented. As a result of them, yields are enhanced.

In a step of forming the wiring trench 13 (see FIG. 1G), the reaction product is also generated, but this reaction product is removed when the resist film 12 and the resin material 11 are removed.

Second Embodiment

Next, a second embodiment of the present invention will be explained. The second embodiment is application of the present invention to a Single Damascene method. FIGS. 4A to 4F are sectional views showing a manufacturing method of a semiconductor device according to the second embodiment of the present invention in the order of steps.

Figure 4A:
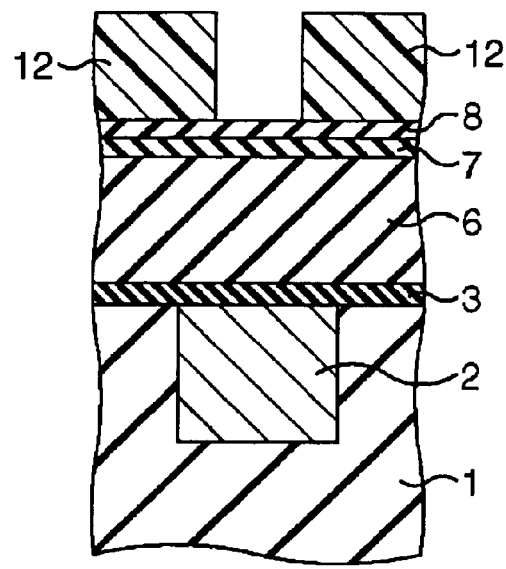
FIGS. 4A to 4F are sectional views showing a manufacturing method of a semiconductor device according to a second embodiment of the present invention in the order of step.

In this embodiment, similarly to the first embodiment, after a semiconductor element (not shown) such as a transistor is initially formed on a surface of the semiconductor substrate (not shown) such as an Si substrate, an interlayer insulating film 1 is formed above the semiconductor substrate, as shown in FIG. 4A. Next, a trench is formed in this interlayer insulating film 1, and a Cu wire 2 connected to the aforesaid semiconductor element is buried inside the trench. Thereafter, an SiC film 3, an SiOC film 6, a TEOS film 7 and an SiN film 8 are formed in sequence on and above the interlayer insulating film 1 and the Cu wire 2. Thickness of the SiC film 3 is 30 nm to 70 nm, thickness of the SiOC film 6 is 300 nm to 600 nm, thickness of the TEOS film 7 is 50 nm to 100 nm, and thickness of the SiN film 8 is 30 nm to 70 nm. Subsequently, a resist film 12 for wiring which is provided with an opening for wiring is formed on the SiN film 8. The thickness of the resist film 12 is, for example, about 500 nm to 800 nm.

Figure 4B:
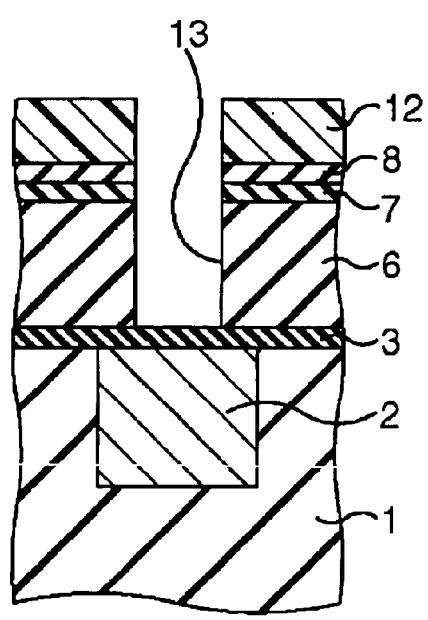

Next, as shown in FIG. 4B, with use of the resist film 12 as a mask, a wiring trench 13 (opening) is formed in the SiN film 8, the TEOS film 7 and the SiOC film 6. The etching condition of each of the films at this time is as follows.

Etching of the SiN film 8 and the TEOS film 7 is continuously performed, for example, under the condition of a flow rate of $CF_4$: 100 sccm, pressure: 6.67 Pa (50 mTorr), RF source power: 300 W, time: 30 seconds, and temperature: 25° C.

Etching of the SiOC film 6 is initially performed, for example, under the condition of the flow rate of $CF_4$: 50 sccm, a flow rate of $CH_2F_2$: 15 sccm, a flow rate of $O_2$: 5 sccm, pressure: 26.6 Pa (200 mTorr), RF source power: 1000 W, time: 30 seconds, and temperature: 25° C. Next, before the etching of the SiOC film 6 is finished, etching is performed, for example, under the condition of a flow rate of $C_4F_6$: 15 Sccm, a flow rate of $O_2$: 30 sccm, a flow rate of CO: 500 sccm, a flow rate of Ar: 300 sccm, pressure: 5.33 Pa (40 mTorr), RF source power: 1000 W, time: 75 seconds, and temperature: 25° C. Under this condition, a selection ratio of the SiOC film 6 and the SiC film 3 is extremely large, and the SiC film 3 is hardly etched.

Figure 4C:
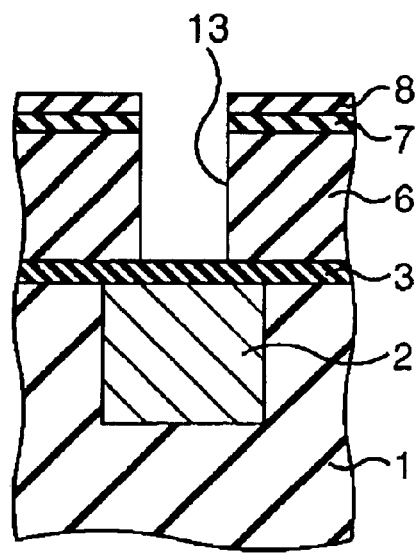

After the wiring trench 13 is formed, the resist film 12 is removed by ashing as shown in FIG. 4C. The ashing condition at this time is, for example, the flow rate of $O_2$: 250 sccm, pressure: 10.7 Pa (80 mTorr), RF source power: 150 W, time: 120 seconds, and temperature: 25° C.

Figure 4D:
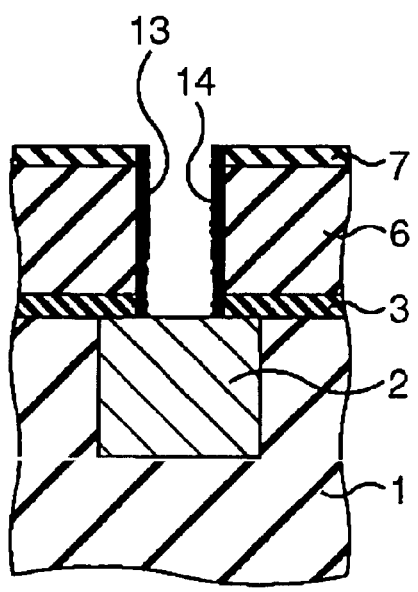

Thereafter, as shown in FIG. 4D, an exposed portion of the SiC film 3 and the SiN film 8 are removed by etching. The etching condition at this time is, for example, the flow rate of $CHF_3$: 15 sccm, the flow rate of $CF_4$: 85 sccm, pressure: 13.3 Pa (100 mTorr), RF source power: 300 W, time: 30 seconds, and temperature: 25° C. As a result of this, the wiring trench 13 reaches the Cu wire 2. A reaction product 14 adheres to a side wall portion of the wiring trench 13.

Figure 4E:
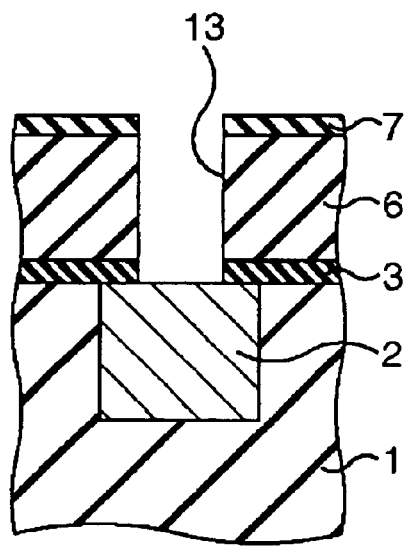

Subsequently, oxygen plasma treatment is performed for the reaction product 14. The treatment condition at this time is, for example, the flow rate of $O_2$: 600 sccm, pressure: 40.0 Pa (300 mTorr), RF source power: 300 W, time: 60 seconds, and temperature: 25° C. As a result of this oxygen plasma treatment, the reaction product 14 is removed as shown in FIG. 4E.

Next, as wet treatment, an entire surface is cleaned by using a chemical solution containing ammonium fluoride, ammonium phosphate, or the like. As a result of this, fine residue and the like are washed away.

Figure 4F:
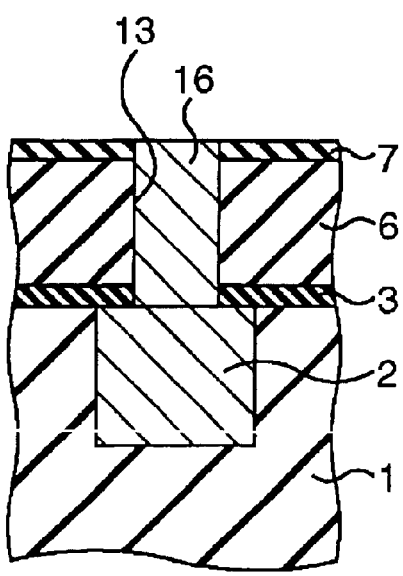

As shown in FIG. 4F, a Cu wire 16 (wire material) is buried in the wiring trench 13. Thereafter, an interlayer insulating film, a wire and the like are further formed as necessary, and the semiconductor device is completed.

According to the second embodiment as above, the reaction product 14 can be also removed, and therefore the same effect as in the first embodiment is obtained.

Cleaning by the wet treatment may be performed before the oxygen plasma treatment, but in order to remove fine residue and the like, it is preferable to perform the wet treatment after the oxygen plasma treatment.

Instead of the oxygen ($O_2$) plasma treatment, treatment using plasma of a gas containing hydrogen, for example, a mixed gas of $N_2$ and $H_2$, a $NH_3$ gas or the like may be performed. With use of plasma of any gas, it is preferable to keep temperature of a wafer stage on which the semiconductor substrate (wafer) is placed at 120° C. or less. This is because there is a possibility that degeneration such as oxidation occurs to the exposed portion of the Cu wire 2 when the temperature of the wafer stage exceeds 120° C. In the plasma treatment apparatus under the present circumstances, the temperature of the wafer stage is easily controlled at 80° C. or less, and when the temperature of the wafer stage is below 15° C., condensation may occur. Therefore, it is more preferable to keep the temperature of the wafer stage at the temperature from 15° C. to 80° C. both inclusive.

Further, the first embodiment is the application of the present invention to the via-first Dual Damascene method, but it is also possible to apply the present invention to a trench-first Dual Damascene method. In this case, it is suitable to perform plasma treatment after making the via hole reach the lower layer wire. It may be suitable to perform wet treatment before or after the plasma treatment, but in order to obtain a high cleaning effect, it is preferable to perform the wet treatment after the plasma treatment.

As the diffusion preventing film, an SiN film may be used instead of the SiC film 3.

As explained in detail thus far, according to the present invention, the reaction product can be removed by the plasma treatment substantially completely, and the wire material buried into the opening thereafter and the conductive layer can be reliably connected. Consequently, rise in contact resistance can be suppressed. Reliability and yields are enhanced by removal of the reaction product.

The present embodiments are to be considered in all respects as illustrative and not restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device having a process of forming a wire in accordance with a Damascene method, comprising the steps of:

forming a diffusion preventing film and an interlayer insulating film in sequence over a conductive layer;

forming an opening reaching the diffusion preventing film in the interlayer insulating film;

performing dry etching for removing a portion of the diffusion preventing film exposed from the opening formed in the interlayer insulating film;

performing plasma treatment, after said dry etching, for at least an inside of the opening by using plasma of a gas containing oxygen or hydrogen; and burying a wire material in the opening.

2. The manufacturing method of the semiconductor device according to claim 1, wherein the interlayer insulating film comprises a silicon oxide film containing carbon atoms.

3. The manufacturing method of the semiconductor device according to claim 1, wherein the plasma treatment is performed with temperature of a stage on which a wafer having the conductive layer being formed is placed being kept at 120° C. or less.

4. The manufacturing method of the semiconductor device according to claim 3, wherein the plasma treatment is performed with the temperature of the stage on which a wafer having the conductive layer being formed is placed being kept at a temperature from 15° C. to 80° C. both inclusive.

5. The manufacturing method of the semiconductor device according to claim 1, wherein the diffusion preventing film comprises a film for preventing metallic elements included in the conductive layer from diffusing into the interlayer insulating film.

6. The manufacturing method of the semiconductor device according to claim 1, wherein the diffusion preventing film comprises a silicon carbide film or a silicon nitride film.

7. The manufacturing method of the semiconductor device according to claim 1, further comprising the step of: forming an etching stopper film and a second interlayer insulating film in sequence over the interlayer insulating film, between said step of forming the interlayer insulating film and said step of forming the opening;

wherein in said step of forming the opening, the opening penetrates the etching stopper film and the second interlayer insulating film;

said manufacturing method, further comprising the step of: forming a wiring trench in the second interlayer insulating film, between said step of forming the opening and said step of performing the dry etching;

wherein said step of performing the dry etching, a portion of the etching, stopper film exposed from the wiring trench formed in the second interlayer insulating film is removed;

wherein in said step of performing the plasma treatment, the plasma treatment is also performed for an inside of the wiring trench; and wherein in said step of burying the wire material, the wire material is also buried in the wiring trench.

8. The manufacturing method of the semiconductor device according to claim 7, wherein the second interlayer insulating film comprises a silicon oxide film containing carbon atoms.

9. The manufacturing method of the semiconductor device according to claim 7, wherein said step of forming the wiring trench has the steps of burying a buried material lower than the interlayer insulating film into the opening;

etching the second interlayer insulating film by using a mask; and removing the buried material.

10. The manufacturing method of the semiconductor device according to claim 1, wherein the conductive layer and the wire material contain copper.

11. The manufacturing method of the semiconductor device according to claim 1, further comprising the step of: performing wet cleaning of a wafer with the conductive layer being formed thereabove, between said step of performing the plasma treatment and said step of burying the wire material.

12. The manufacturing method of the semiconductor device according to claim 1, further comprising the step of: performing wet cleaning of a wafer with the conductive layer being formed thereabove, between said step of performing the dry etching and said step of performing the plasma treatment.

13. The manufacturing method of the semiconductor device according to claim 1, wherein one kind of gas selected from a mixed gas of hydrogen and nitrogen, an ammonia gas, and an oxygen gas is used as the gas containing oxygen or hydrogen.

14. The manufacturing method of the semiconductor device according to claim 1, wherein in said step of forming the opening, a resist mask is used.

15. The manufacturing method of the semiconductor device according to claim 14, further comprising the step of: removing the resist mask by ashing, before said step of performing plasma treatment.

* * * * *